(12) United States Patent
Sato

(10) Patent No.: US 6,660,550 B2
(45) Date of Patent: Dec. 9, 2003

(54) SURFACE EMISSION TYPE SEMICONDUCTOR LIGHT-EMITTING DEVICE AND METHOD OF MANUFACTURING THE SAME

(75) Inventor: Atsushi Sato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/095,570

(22) Filed: Mar. 13, 2002

(65) Prior Publication Data

US 2002/0142506 A1 Oct. 3, 2002

(30) Foreign Application Priority Data

Mar. 30, 2001  (JP) ........................................ 2001-101516

(51) Int. Cl.[7] ........................... H01L 21/00; H01L 33/00
(52) U.S. Cl. ............................. 438/34; 438/29; 438/33; 438/462; 257/95; 257/98
(58) Field of Search ............................. 257/95, 98, 100, 257/88; 438/460, 462, 465, 33, 34, 29

(56) References Cited

U.S. PATENT DOCUMENTS

| | | | | | |
|---|---|---|---|---|---|
| 3,740,616 A | * | 6/1973 | Suzuki et al. | ................... | 257/89 |
| 4,610,079 A | * | 9/1986 | Abe et al. | .................... | 438/462 |
| 4,742,378 A | * | 5/1988 | Ito et al. | ........................ | 372/46 |
| 4,897,846 A | * | 1/1990 | Yoshida et al. | ................ | 372/46 |
| 5,024,970 A | * | 6/1991 | Mori | | |
| 5,055,422 A | * | 10/1991 | Weisbuch et al. | .............. | 372/46 |
| 5,096,855 A | * | 3/1992 | Vokoun, III | ................. | 438/462 |
| 5,157,001 A | * | 10/1992 | Sakuma | ....................... | 438/465 |
| 5,289,018 A | * | 2/1994 | Okuda et al. | .................. | 257/98 |
| 5,314,844 A | * | 5/1994 | Imamura | ........................ | 225/2 |
| 5,414,297 A | * | 5/1995 | Morita et al. | ................ | 257/620 |
| 5,418,799 A | * | 5/1995 | Tada | ............................ | 372/44 |
| 5,498,883 A | * | 3/1996 | Lebby et al. | .................. | 257/95 |
| 5,521,125 A | * | 5/1996 | Ormond et al. | ............. | 438/465 |
| 5,665,655 A | * | 9/1997 | White | ......................... | 438/584 |
| 6,168,962 B1 | * | 1/2001 | Itoh et al. | ..................... | 438/22 |
| 6,207,477 B1 | * | 3/2001 | Motooka et al. | ............ | 438/113 |

FOREIGN PATENT DOCUMENTS

JP          07-094825 A       4/1995

* cited by examiner

Primary Examiner—Matthew Smith
Assistant Examiner—Lex H Malsawma
(74) Attorney, Agent, or Firm—Oliff & Berridge, PLC

(57) ABSTRACT

A method of manufacturing a semiconductor light-emitting device includes: a step of forming a stacked semiconductor layer having a plurality of columnar portions over a semiconductor substrate, a step of forming an embedding insulation layer of a resin material around each of the columnar portions, and a step of separating a wafer to form chips. In the step of forming the stacked semiconductor layer having the columnar portions, a separating semiconductor layer of a given pattern is formed in boundary regions of the chips; in the step of forming the embedding insulation layer, at least an upper surface of the separating semiconductor layer is exposed; and in the step of forming the chips, the separation is carried out using the separating semiconductor layer.

22 Claims, 7 Drawing Sheets

SURFACE EMISSION TYPE SEMICONDUCTOR LIGHT-EMITTING DEVICE AND METHOD OF MANUFACTURING THE SAME

Japanese Patent Application No. 2001-101516, filed on Mar. 30, 2001, is hereby incorporated by reference in its entirety.

BACKGROUND OF THE INVENTION

The present invention relates to a surface emission type semiconductor light-emitting device such as a surface emission type semiconductor laser or light emitting diode, and a method of manufacture thereof.

For example, in a surface emission type semiconductor laser, it is known to have a columnar portion constituting a resonator and embedded on its periphery in a resin material such as polyimide or the like. However, when an embedding insulation layer of such a resin material is used, when the wafer on which the light-emitting element is formed is separated, the following problems may occur. Specifically, since the embedding insulation layer formed of the resin material has a higher plasticity than the semiconductor layer and is harder to cut, it is difficult to prevent cleavage of the semiconductor layer and accurately separate the wafer by scribe. For the same reason, when the wafer is separated by dicing, external force applied to the embedding insulation layer may adversely affect the light-emitting element. If in this way the wafer cannot be satisfactorily separated, this may lead to problems such as particle emission, die attach and die bonding defects, chip damage, and so on.

BRIEF SUMMARY OF THE INVENTION

The present invention may provide a method of manufacturing a semiconductor light-emitting device using a resin material as an embedding insulation layer, in which wafer separation can be carried out reliably and easily, and the semiconductor light-emitting device.

The method of manufacturing a semiconductor light-emitting device according to one aspect of the present invention comprises:

a step of forming a stacked semiconductor layer having a plurality of columnar portions over a semiconductor substrate;

a step of forming an embedding insulation layer of a resin material around each of the columnar portions; and a step of separating the semiconductor substrate and layers on the semiconductor substrate to form chips, wherein in the step of forming the stacked semiconductor layer having the columnar portions, a separating semiconductor layer of a given pattern is formed in boundary regions of the chips, wherein in the step of forming the embedding insulation layer, at least an upper surface of the separating semiconductor layer is exposed, and wherein in the step of forming the chips, the separation is carried out using the separating semiconductor layer.

According to the manufacturing method of the present invention, by using the separating semiconductor layer, the separation of the wafer (the semiconductor substrate and the layers formed on the substrate) can be carried out reliably and easily.

The method of this aspect may have the following features.

(a) The columnar portions and the separating semiconductor layer may be patterned by lithography and etching after forming the stacked semiconductor layer on the semiconductor substrate.

(b) A step of forming an electrode layer in a given pattern may be included after the step of forming the embedding insulation layer. An end of the electrode layer may be formed away from the separating semiconductor layer.

(c) The separating semiconductor layer may have the following structures.

The separating semiconductor layer may be continuously formed in the boundary regions of the chips, and the separation of a wafer maybe carried out along the separating semiconductor layer.

The separating semiconductor layer may be discontinuously formed in the boundary regions of the chips, and the separation of a wafer may be carried out along the separating semiconductor layer.

Furthermore, two of the separating semiconductor layers may be formed with a given spacing in the boundary regions of the chips, and the separation of a wafer may be carried out between the two separating semiconductor layers. Between the two separating semiconductor layers, an insulation layer may be formed in the step of forming the embedding insulation layer.

(d) The separating semiconductor layer may have a reinforcing portion formed in an intersecting region thereof. The reinforcing portion may be formed of a semiconductor layer formed at a corner of the separating semiconductor layer. The reinforcing portion may be formed of an insulation layer formed in an intersecting region of the separating semiconductor layer, and the insulation layer may be formed in the step of forming the embedding insulation layer.

The semiconductor light-emitting device according to another aspect of the present invention has the following structure, reflecting the above manufacturing method. Specifically, this aspect of the present invention relates to a surface emission type semiconductor light-emitting device which emits light in a direction perpendicular to a semiconductor substrate, the semiconductor light-emitting device comprising:

a stacked semiconductor layer formed over a semiconductor substrate, and having a columnar portion;

an embedding insulation layer of a resin material formed around the columnar portion;

an electrode layer formed on at least a part of an upper surface of the columnar portion and a part of an upper surface of the embedding insulation layer; and a separating semiconductor layer formed above an edge region of the semiconductor substrate.

The following features may be applied to the semiconductor light-emitting device of this aspect of the present invention.

The separating semiconductor layer may be formed in the step of forming the columnar portion of the stacked semiconductor layer and may have the same stacked structure as the columnar portion.

An end of the electrode layer may be formed away from the separating semiconductor layer. By means of this structure, electrical isolation of the electrode layer and the semiconductor substrate can be achieved.

The separating semiconductor layer may be continuously formed above the edge region of the semiconductor substrate. The separating semiconductor layer may be discontinuously formed above the edge region of the semiconductor substrate. Furthermore, an insulation layer may be formed above the edge regions of the semiconductor substrate, and the separating semiconductor layer may be located inside the insulation layer.

The separating semiconductor layer may have a reinforcing portion formed in an intersecting region thereof. The reinforcing portion may be formed of a semiconductor layer formed at a corner of the separating semiconductor layer. The reinforcing portion may be formed of an insulation layer formed in an intersecting region of the separating semiconductor layer, and the insulation layer may have the same layer construction as the embedding insulation layer.

The semiconductor light-emitting device of the present invention may be applied to a surface emission type semiconductor laser or a surface emission type light emitting diode, or the like.

DETAILED DESCRIPTION OF THE EMBODIMENTS

Embodiments of the present invention applied to a surface emission type semiconductor laser are now described, with reference to the drawings.

First Embodiment
Device Structure

Figure 1:
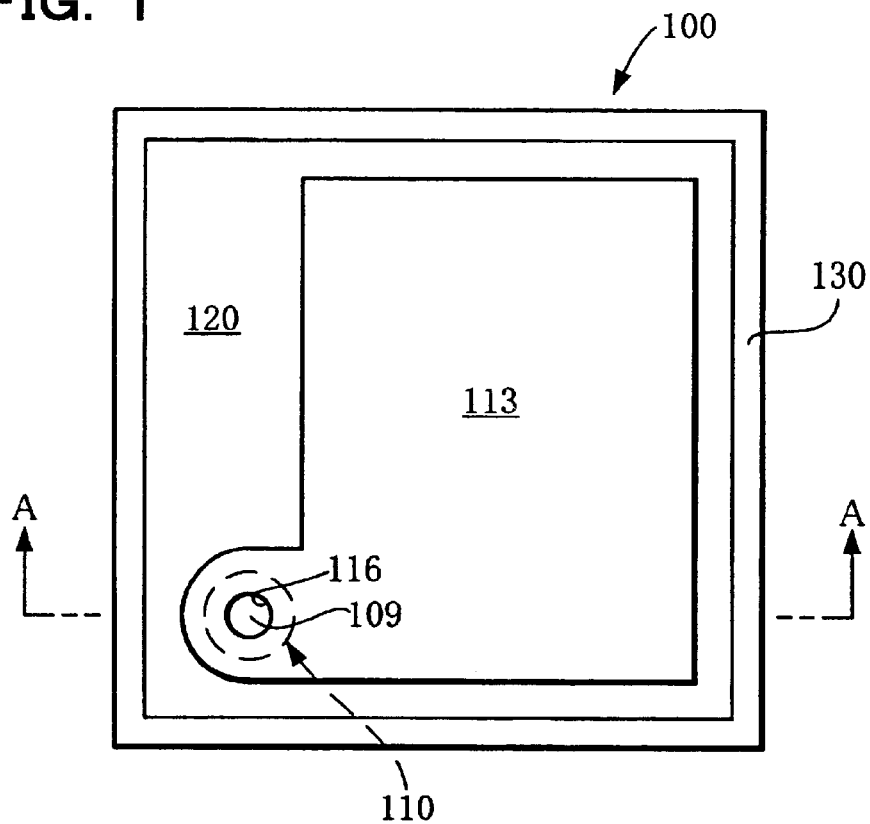
FIG. 1 is a schematic plan view of a surface emission type semiconductor laser according to a first embodiment of the present invention.
Figure 2:
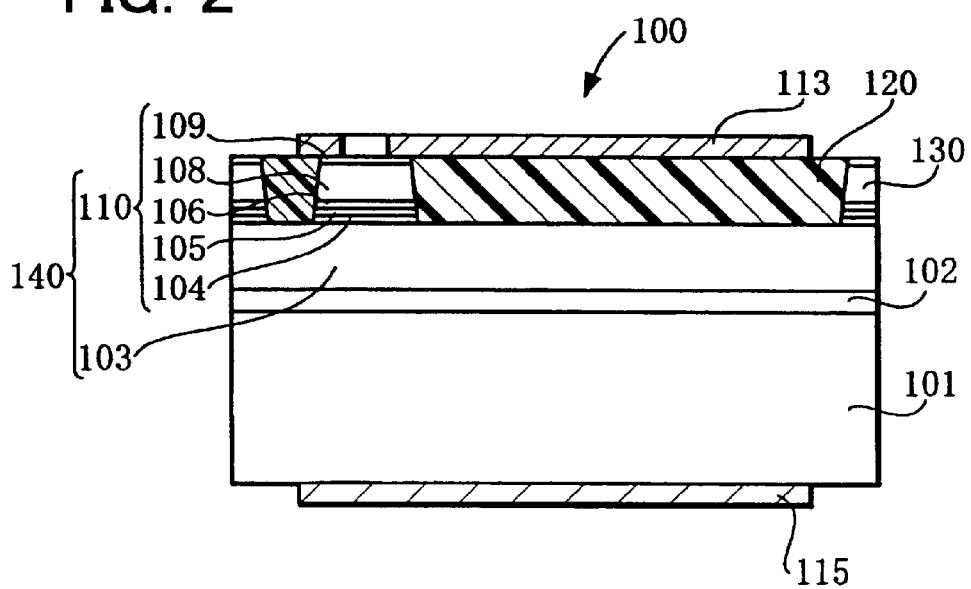
FIG. 2 is a sectional view along the line A—A in FIG. 1.

FIG. 1 is a plan view of a first embodiment of the surface emission type semiconductor laser (hereinafter referred to as "surface emission laser") 100 of the present invention, and FIG. 2 is a sectional view along the line A—A in FIG. 1.

First, the structure of the surface emission laser 100 shown in FIGS. 1 and 2 is described.

The surface emission laser 100 comprises a vertical resonator (hereinafter referred to as "resonator") 140, a columnar portion 110 constituting a part of this resonator 140, an embedding insulation layer 120 formed around the columnar portion 110, and a separating semiconductor layer 130 formed above the edge region of the semiconductor substrate 101.

Specifically, the surface emission laser 100 comprises the semiconductor substrate 101, and a buffer layer 102 of n-type GaAs formed on the semiconductor substrate 101 and the resonator 140.

The resonator 140, provided that it functions as the resonator of the surface emission laser 100 is not particularly restricted in structure, and may for example have the following structure.

The resonator 140 is formed on the buffer layer 102, and is constituted by a distributed reflection type multilayer film mirror (hereinafter referred to as the "lower mirror") 103 of 30 pairs of alternately laminated n-type AlAs layers and n-type $Al_{0.15}Ga_{0.85}As$ layers, an n-type cladding layer 104 of n-type $Al_{0.5}Ga_{0.85}As$, an active layer 105 comprising GaAs well layers and $Al_{0.3}Ga_{0.7}As$ barrier layers in which the well layers form a three-layer multiple well structure, p-type cladding layer 106 of $Al_{0.5}Ga_{0.5}As$, a distributed reflection type multilayer film mirror (hereinafter referred to as the "upper mirror") 108 of 25 pairs of alternately laminated p-type $Al_{0.85}Ga_{0.15}As$ layers and p-type $Al_{0.15}Ga_{0.85}As$ layers, and a contact layer 109 of p-type GaAs in that order.

The resonator 140, as required, may have a current concentrating layer. This current concentrating layer can be provided, for example, between the p-type cladding layer 106 and the upper mirror 108. The current concentrating layer, for example, can be constituted by a semiconductor layer of p-type AlAs and an insulation layer formed around this semiconductor layer. This insulation layer can be constituted by an insulator formed in a region of a few micrometers from the periphery of the current concentrating layer, for example, of aluminum oxide. By providing the current concentrating layer, current from an upper electrode layer 113 can be concentrated in the central portion of the columnar portion 110.

The upper mirror 108 is of p-type as a result of doping with Zn, and the lower mirror 103 is of n-type as a result of doping with Se. Therefore, a pin diode is formed by the upper mirror 108, the active layer 105 which is not doped with impurities, and the lower mirror 103.

The portion of the resonator 140 from the laser light emission side of the surface emission laser 100 to the n-type cladding layer 104 is formed by etching into a circular shape as seen from the laser light emission side, to form the columnar portion 110. That is to say, the columnar portion 110 is a part of the resonator 140, formed by a stacked semiconductor in a columnar shape. It should be noted that in this embodiment, the plan form of the columnar portion 110 is circular, but this form can be of any shape.

In the surface emission laser 100, the embedding insulation layer 120 is embedded around the columnar portion 110. That is to say, the embedding insulation layer 120 is formed so as to contact the periphery of the columnar portion 110, and to cover the upper surface of the lower mirror 103.

As the resin material for forming the embedding insulation layer 120, for example, a polyimide resin, an acrylic resin, or an epoxy resin, or the like, which is cured by irradiating with energy such as heat or light can be used.

The surface emission laser 100 has a separating semiconductor layer 130 continuously formed at its edge and above the edge region of the semiconductor substrate 101. In this embodiment, this separating semiconductor layer 130 is formed in the same step as the columnar portion 110, and therefore has the same layer structure as the columnar portion 110. The separating semiconductor layer 130, as described below, in the method of manufacturing the surface emission laser 100, is efficient for ensuring that the separation is carried out reliably and with high precision in the step of separating the wafer into chips, on the upper surface of the columnar portion 110 and embedding insulation layer 120, the upper electrode layer 113 is formed with a given pattern. The upper electrode layer 113 is patterned so that its edge is positioned away from the separating semiconductor layer 130. That is to say, the separating semiconductor layer 130 and upper electrode layer 113 are electrically isolated by the embedding insulation layer 120. The upper electrode layer 113 and separating semiconductor layer 130 preferably have their minimum distance on the order of 10 μm. By the upper electrode layer 113 and separating semiconductor layer 130 being separated at least to this degree, for example, contact between bumps for bonding formed on the upper electrode layer 113 and the separating semiconductor layer 130 can be adequately avoided. Between the columnar portion 110 and the separating semiconductor layer 130, the embedding insulation layer 120 is also provided.

Furthermore, in the center of the upper surface of the columnar portion 110, an aperture 116 is formed as a laser light emission opening. On the surface of the semiconductor substrate 101 opposite to that on which the resonator 140 is formed, a lower electrode layer 115 is formed. It should be noted that in order that in the subsequent step of separating into chips separation using the separating semiconductor layer 130 is not hindered, the lower electrode layer 115 is preferably not formed at least in the portion corresponding to the region in which the separating semiconductor layer 130 is formed.

The operation of the first embodiment of the surface emission laser 100 is now described.

When a voltage is applied by the upper electrode layer 113 and lower electrode layer 115 to the pin diode in the forward direction, in the active layer 105, recombination of electrons and holes occurs, and light is emitted as a result of this recombination. As this generated light oscillates between the upper mirror 108 and the lower mirror 103 stimulated emission occurs, and the intensity of the light is amplified. When the optical gain exceeds the optical loss, laser emission occurs, and laser light is emitted from the aperture of the upper electrode layer 113 in the direction perpendicular to the semiconductor substrate 101.

According to this embodiment, as described below, since the wafer separation can be carried out accurately, the form of the resonator 140 has high stability, and a surface emission laser 100 of uniform structure can be obtained. As a result, according to this embodiment of the surface emission laser 100, by virtue of its geometrical stability, there is little fluctuation in the threshold current, current gain, emission power, and so on. Process of manufacturing the device Next, the method of manufacturing this embodiment of the surface emission laser 100 is described, with reference to FIGS. 3 to 8. FIGS. 3 to 8 show schematically a wafer 1000 in the process of the method of manufacturing this embodiment of the surface emission laser 100. Here, the wafer 1000 refers inclusively to the wafer in any state having layers formed on the semiconductor substrate in the various steps of the process.

The method of manufacturing this embodiment of the surface emission laser 100 includes the following steps (a) to (c).

(a) A step of forming a stacked semiconductor layer 150 having a plurality of columnar portions 110 on the semiconductor substrate 101;

(b) A step of forming the embedding insulation layer 120 of a resin material around the columnar portion 110; and (c) A step of separating the wafer, that is to say the semiconductor substrate 101 and the layers on this semiconductor substrate 101, to form chips.

Then in the step of forming the stacked semiconductor layer 150 having the columnar portions 110, the separating semiconductor layer 130 is formed in the chip boundary regions with a given pattern. In the step of forming the embedding insulation layer 120, at least the upper surface of the separating semiconductor layer 130 is exposed. Furthermore, in the step of forming chips, the chips are separated using the separating semiconductor layer 130.

The method of manufacturing this embodiment is now described specifically with reference to the drawings.

Figure 4:
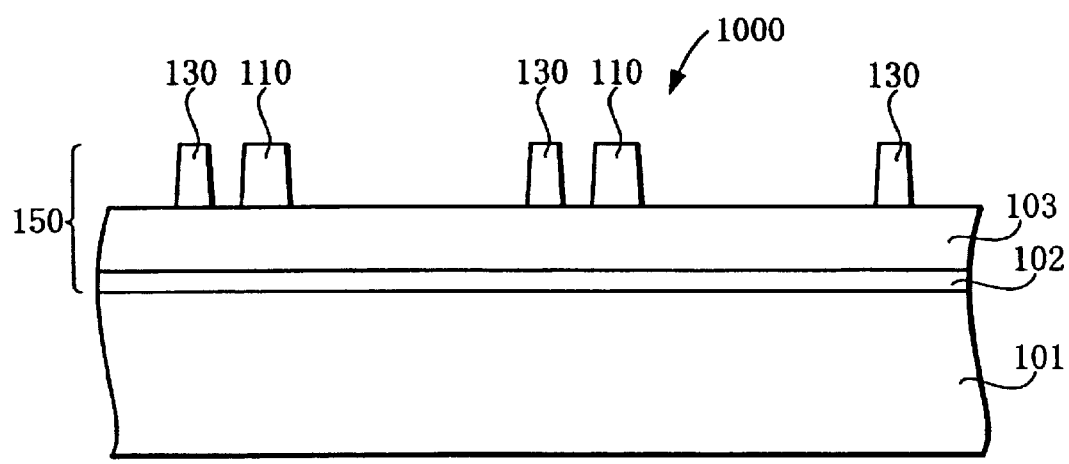
FIG. 4 is a sectional view along the line B—B in FIG. 3.

(a) An the surface of the semiconductor substrate 101 shown in FIG. 4 and formed of n-type GaAs, the stacked semiconductor layer 150 is formed by epitaxial growth while varying the composition. Here, the stacked semiconductor layer 150, as shown in FIG. 2, has the buffer layer 102 of n-type GaAs, the lower mirror 103 of alternately deposited n-type AlAs layers and n-type $Al_{0.15}Ga_{0.85}As$ layers, the n-type cladding layer 104 of n-type $Al_{0.5}Ga_{0.5}As$, the active layer 105 having GaAs well layers and $Al_{0.3}Ga_{0.7}As$ barrier layers in which the well layers form a three-layer multiple well structure, the p-type cladding layer 106 of $Al_{0.5}Ga_{0.5}As$, the upper mirror 108 having alternately deposited p-type $Al_{0.85}Ga_{0.15}As$ layers and p-type $Al_{0.85}Ga_{0.15}As$ layers, and the contact layer 109 of p-type GaAs. The surface of the semiconductor substrate 101 referred to is the surface of the semiconductor substrate 101 on which in a later step the resonator 140 will be formed.

The temperature while epitaxial growth is carried out may be determined appropriately, depending on the type of the semiconductor substrate 101 and the type and thickness of the stacked semiconductor layer 150 being formed, but may generally be in the range 600° C. to 800°C. The time required for the epitaxial growth is determined in a similar manner to the temperature. As the method of epitaxial growth, Metal-Organic Vapor Phase Epitaxy (MOVPE), Molecular Beam Epitaxy (MBE), or Liquid Phase Epitaxy (LPE) can be used.

Figure 3:
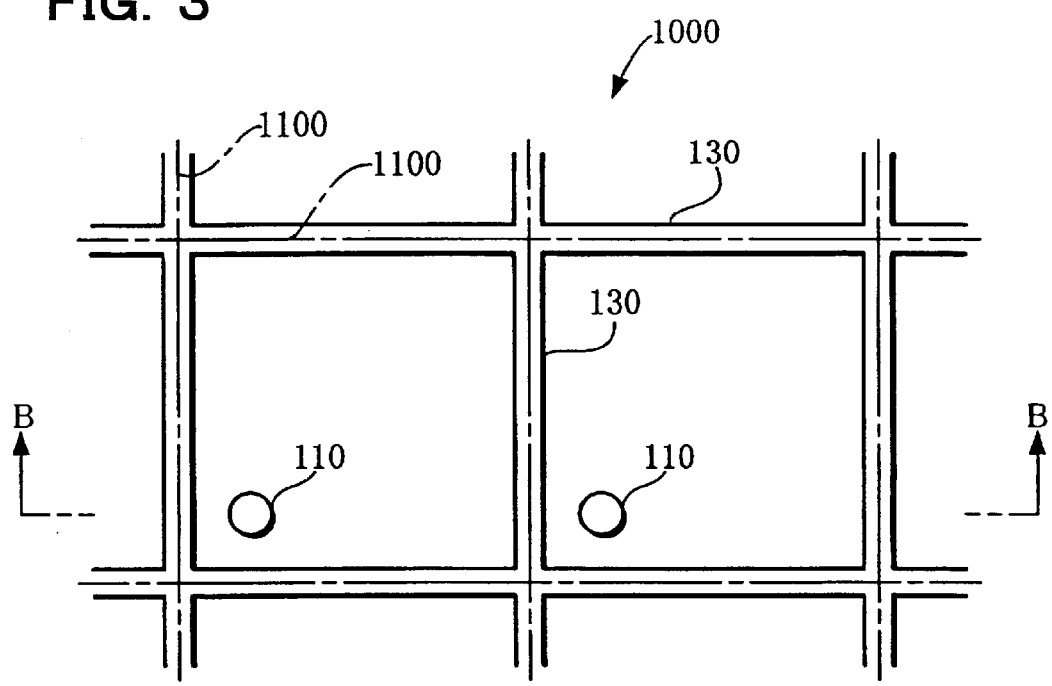
FIG. 3 is a schematic plan view of one step in a method of manufacturing the surface emission type semiconductor laser according to the first embodiment of the present invention.

Then as shown in FIGS. 3 and 4, the stacked semiconductor layer 150 is patterned, and the columnar portion 110 forming a part of the resonator 140 (see FIG. 2) and the separating semiconductor layer 130 are formed. FIG. 3 is a plan view of the wafer 1000, and FIG. 4 is a sectional view along the line B—B in FIG. 3.

Specifically, after applying a photoresist (not shown in the drawings) to the stacked semiconductor layer 150, this photoresist is patterned by photolithography, whereby a resist layer (not shown in the drawings) of a particular pattern is formed. Then with this resist layer as a mask, by the dry etching method, the upper part of the stacked semiconductor layer 150 (layers corresponding to the contact layer 109, upper mirror 108, p-type cladding layer 106, active layer 105, and n-type cladding layer 104 shown in FIG. 2) are etched, and a plurality of columnar portions 110 is formed of a stacked semiconductor in a columnar shape, and the continuous separating semiconductor layer 130 surrounding the columnar portions 110 is formed. In this embodiment, the separating semiconductor layer 130, as shown in FIG. 3, is formed along chip boundary regions, and has a rectangular ring shape. In FIG. 3, a broken line 1100 shows the line of separation when forming the chips.

Next, a current concentrating layer is formed as required.

Specifically, for example, the p-type AlAs layer formed between the p-type cladding layer 106 and the upper mirror 108 is exposed to a steam atmosphere at about 400° C. By this process, the AlAs layer is oxidized from its surface to the interior, and insulating aluminum oxide is formed. That is to say, the exterior of the p-type AlAs layer is oxidized, and a current concentrating layer is formed of aluminum oxide on the outside of the p-type AlAs layer.

Figure 5:
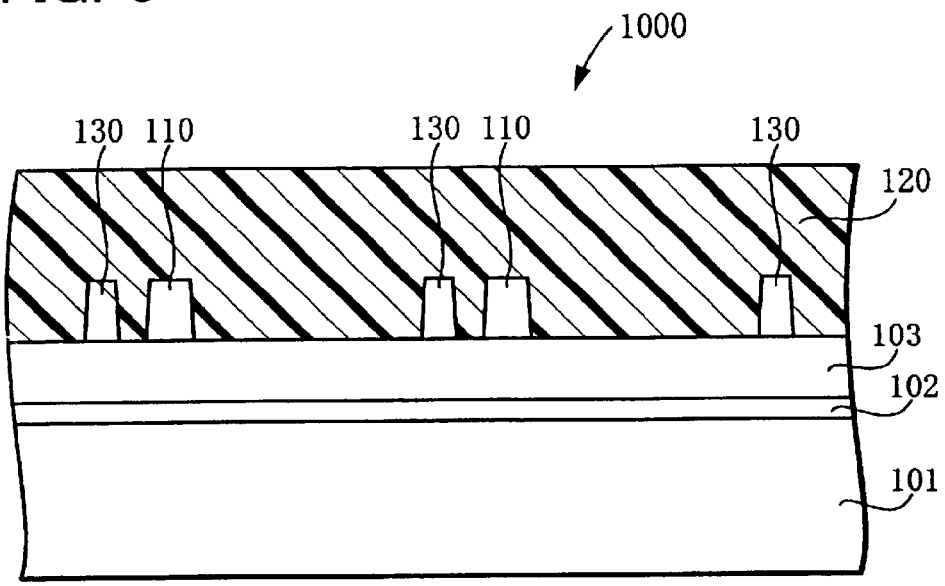
FIG. 5 is a schematic sectional view of the one step in the method of manufacturing the surface emission type semiconductor laser according to the first embodiment of the present invention.
Figure 6:
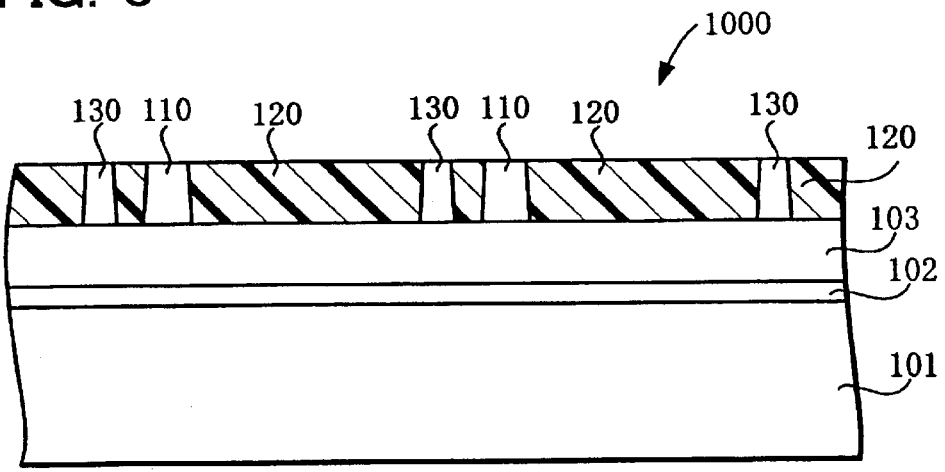
FIG. 6 is a schematic sectional view of the one step in the method of manufacturing the surface emission type semiconductor laser according to the first embodiment of the present invention.

(b) Next, as shown in FIGS. 5 and 6, the embedding insulation layer formed of a resin material 120 is formed.

Specifically, first, resin in liquid form or resin precursor in liquid form is applied on the wafer 1000, after which it is dried. As the method of application, spin coating, dipping, spray coating, or other well known techniques may be used.

Then the resin raw material on the wafer 1000 is irradiated with energy such as heat or light, and the embedding insulation layer 120 is cured. Next, the resin layer over the embedding insulation layer 120 is removed, and the upper surface of the columnar portion 110 and separating semiconductor layer 130 is exposed. As the method of removing the resin layer can be used: the method of using photolithography to pattern the resin, the etch-back method using dry etching, the CMP method, the method of patterning by photolithography using a photosensitive resin material, the develop-dip method of removing the resin layer by wet etching, or other well known methods.

By means of the above process, between the columnar portions 110 and the separating semiconductor layer 130, the embedding insulation layer 120 can be formed.

As the resin in liquid form or resin precursor in liquid form used in the above process, a resin which is cured by irradiating with energy such as heat or light is used. As the resin in liquid form, for example, may be cited a polyacrylic resin, or an epoxy resin. As the resin precursor in liquid form may be cited a polyimide precursor.

As the polyimide resin maybe cited, for example, polyamic acid, or polyamic acid long chain alkyl ester. When a polyimide resin is used as the resin precursor in liquid form, after applying the polyimide precursor in liquid form on the wafer, an imidization reaction is caused by heat treatment, and a polyimide resin is formed. The temperature of this heat treatment depends on the type of polyimide precursor, but from 150° C. to 400° C. is appropriate.

When a polyacrylic resin or an epoxy resin is used as the resin in liquid form, a polyacrylic resin or epoxy resin of a type cured by ultraviolet radiation may be preferable. A type of resin cured by ultraviolet radiation can be cured by irradiation with ultraviolet radiation only, and therefore the problems of heat damage to the element and so on do not arise.

Figure 7:
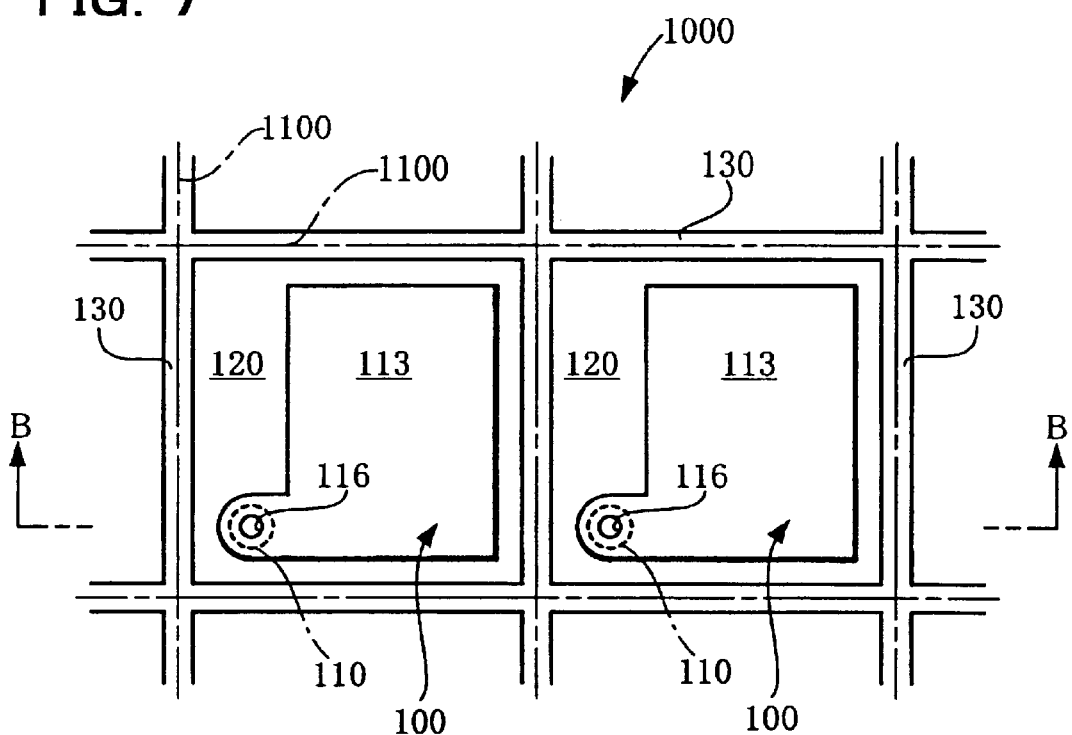
FIG. 7 is a schematic sectional view of the one step in the method of manufacturing the surface emission type semiconductor laser according to the first embodiment of the present invention.
Figure 8:
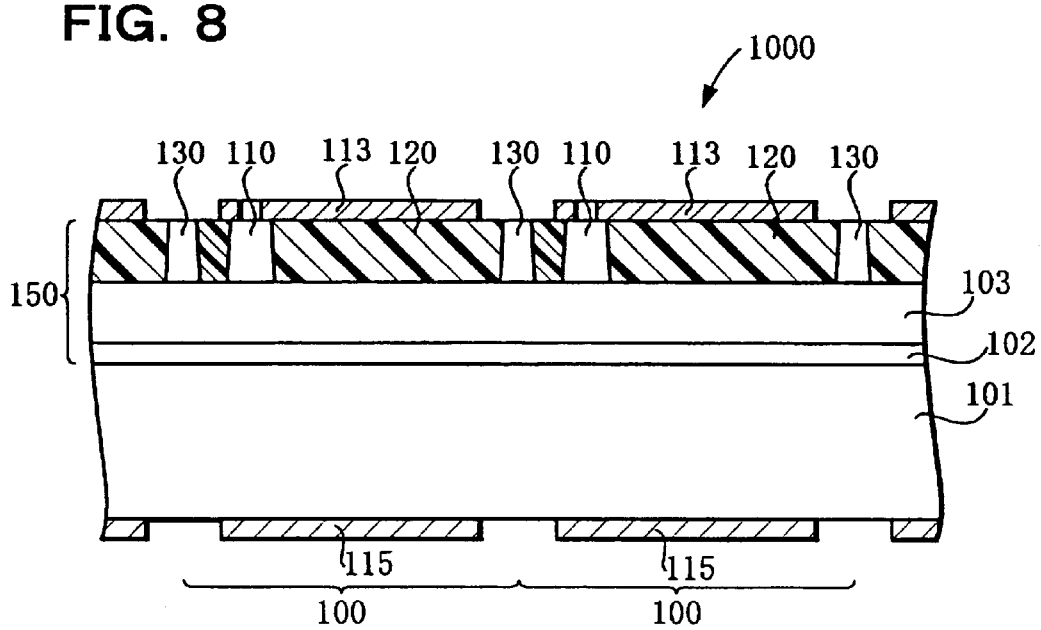
FIG. 8 is a sectional view along the line B—B in FIG. 7.

(c) As shown in FIGS. 7 and 8, the upper electrode layer 113 and lower electrode layer 115 are formed. FIG. 7 is a plan view of the wafer 1000, and FIG. 8 is a sectional view along the line B—B in FIG. 7.

Specifically, for example, by means of vacuum deposition, on the upper surface of the columnar portion 110 and embedding insulation layer 120, an alloy layer of gold or zinc is formed, after which, using photoetching, the alloy layer is patterned, whereby the aperture 116 is formed. By means of the above process, the upper electrode layer 113 is formed. Next, on the reverse surface of the semiconductor substrate 101 (the surface of the semiconductor substrate 101 opposite to that on which the resonator 140 is formed), for example, after an alloy layer of gold and germanium is formed by vacuum deposition, the alloy layer is patterned using photoetching, whereby the lower electrode layer 115 is formed.

(d) Next, as shown in FIG. 7, by separating the wafer 1000 along the notional separation line 1100 on the separating semiconductor layer 130, the surface emission laser 100 chips are formed.

As the method of wafer separation, at least either of the separating scribe method utilizing the cleavage of a compound semiconductor, and the dicing method can be used. As the scribe method, either of an all-surface scribe and a side-surface scribe can be used. In this embodiment, since the separating semiconductor layer 130 is exposed in the entire chip boundary regions on which the separation line 1100 is determined, by forming a scratch along the separation line 1100 with a diamond scriber or the like, the wafer 1000 can be reliably separated by the scribe method, and the chips can be formed.

Through the above process, the surface emission laser 100 shown in FIGS. 1 and 2 is obtained.

According to the method of manufacturing this embodiment of the surface emission laser 100, in the stage of separating the wafer 1000, a layer formed of resin material is not formed in the separated part of the wafer 1000 (or the chip boundary regions), and only the separating semiconductor layer 130 is formed. As a result, the separation of the wafer 1000 can be carried out reliably and easily. Since the separating semiconductor layer 130 can be subjected to cleavage in the same way as the semiconductor substrate 101, as described in (d) above, a scribe method can be used as the means for separating the wafer 1000.

In this embodiment, when separating the wafer 1000 into the surface emission laser 100 chips, dicing can be used. In this case, the separating semiconductor layer 130 only is formed, and the resin insulation layer is not formed in the area for cutting with the dicing saw. Therefore, the dicing saw is not contaminated by the resin, and since no resin particles are included, particles can be cleaned easily.

Second Embodiment

Figure 9:
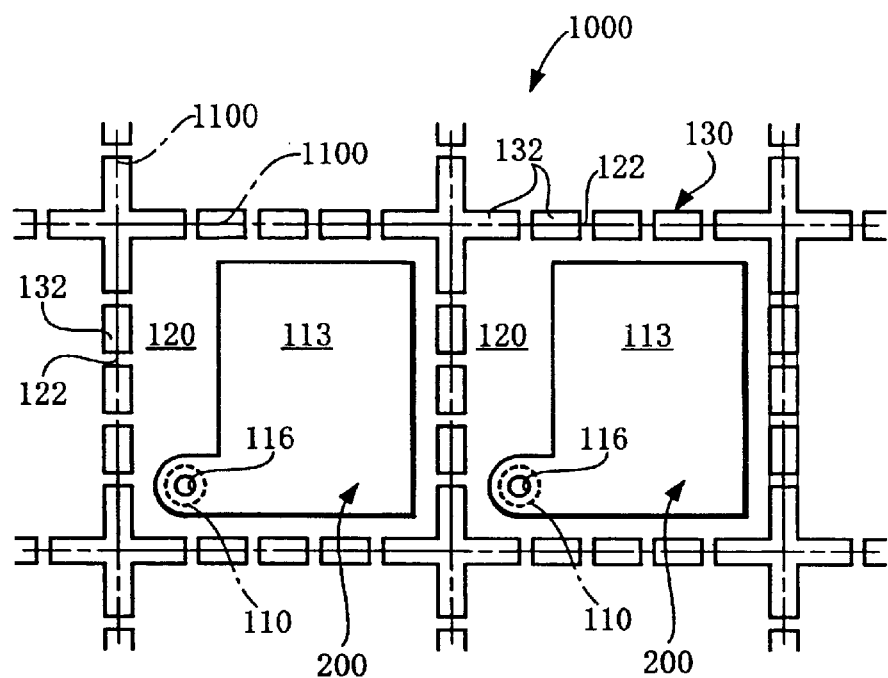
FIG. 9 is a schematic plan view of one step in a method of manufacturing the surface emission type semiconductor laser according to a second embodiment of the present invention.
Figure 10:
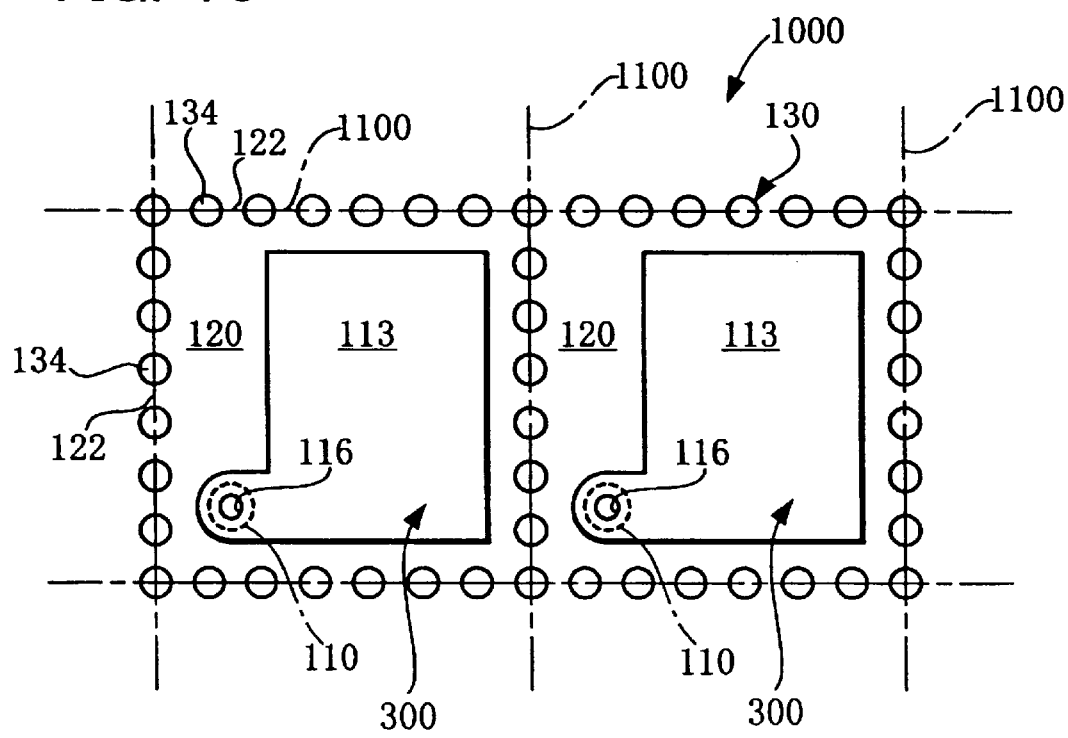
FIG. 10 is a schematic plan view of the one step in the method of manufacturing the surface emission type semiconductor laser according to a second embodiment of the present invention.

Each of FIGS. 9 and 10 is a schematic plan view of one step in a method of manufacturing the surface emission type semiconductor laser according to this embodiment of the present invention. These figures correspond to FIG. 7, which shows the first embodiment.

This embodiment of the surface emission laser 200, 300 differs from the surface emission laser 100 of the first embodiment in that the separating semiconductor layer 130 is discontinuously formed. Since in other respects it is basically the same as the first embodiment, portions with portions with substantially the same functions are given the same reference numerals, and detailed description is omitted.

In the wafer 1000 shown in FIG. 9 having the surface emission laser 200, the separating semiconductor layer 130 is formed along the chip boundary regions. This separating semiconductor layer 130 is formed by detached semiconductor layer portions 132 formed along the separation line 1100. In the example shown in the drawing, the semiconductor layer portions 132 are formed as separated portions of a semiconductor layer in a line, and an insulation layer 122 continuous with the embedding insulation layer 120 is provided between the semiconductor layer portions 132.

The form of the semiconductor layer portions constituting the separating semiconductor layer 130 is not limited to that shown in FIG. 9, and various forms are possible. For example, in the wafer 1000 shown in FIG. 10 having the surface emission laser 300, the separating semiconductor layer 130 is formed by detached semiconductor layer portions 134 of round shape formed along the separation line 1100.

In these wafers 1000 having the surface emission laser 200, 300, the same effect is obtained as in the surface emission laser 100 of the first embodiment. That is to say, by separating the semiconductor substrate 101, separating semiconductor layer 130, and insulation layer 122 along the separation line 1100, the surface emission laser 200, 300 can be reliably and easily formed into chips.

In this embodiment, the resin insulation layer 122 is discontinuously formed along the separation line 1100, but by appropriately determining the size and layout of the insulation layer 122, any obstruction to the separation of the wafer 1000 can be eliminated. By the presence of the insulation layer 122, the film thickness of the embedding insulation layer 120 in the boundary regions of adjacent surface emission lasers can be made uniform, and fluctuations from element to element can be reduced.

As the method of separation of the wafer 1000, in the same way as in the first embodiment, at least either of the separating scribe method utilizing the cleavage of a compound semiconductor, and the dicing method can be used. In this case, if the side-surface scribe method is used, the separation of the wafer 1000 can be carried out most reliably.

In this embodiment of the surface emission laser 200, 300, at the margin, the structure is such that after separation the semiconductor layer portions 132, 134 are arranged discontinuously.

Third Embodiment

Figure 11:
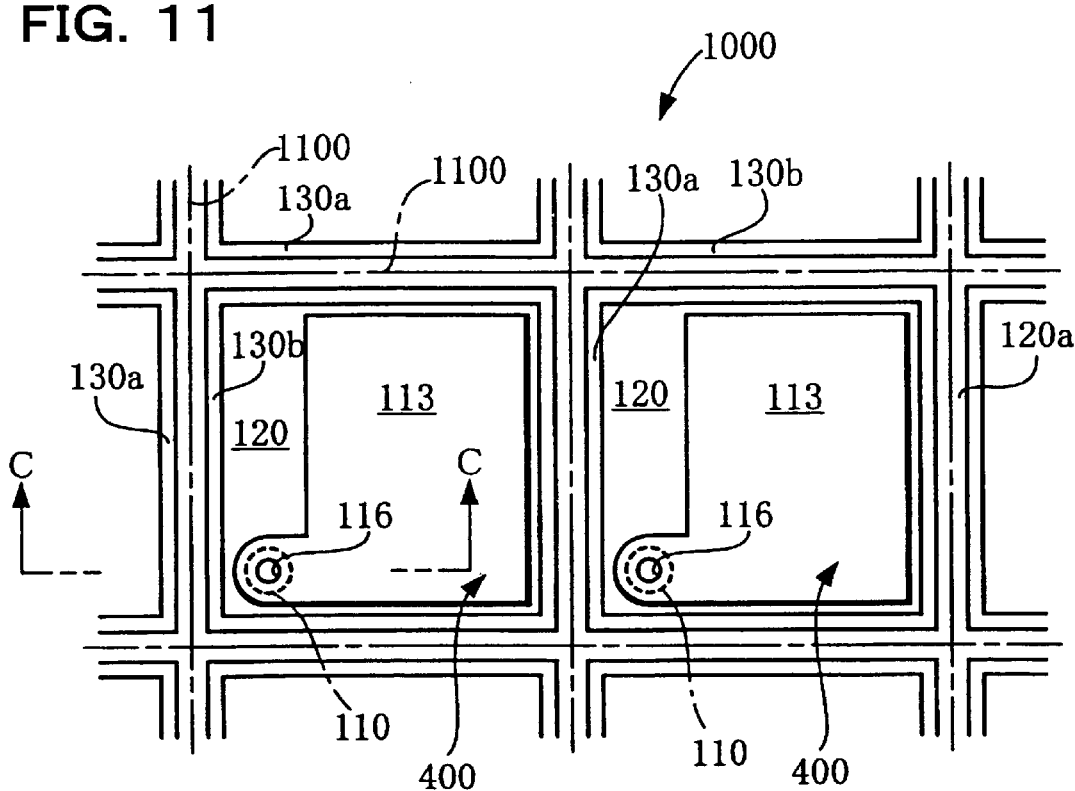
FIG. 11 is a schematic plan view of one step in a method of manufacturing the surface emission type semiconductor laser according to a third embodiment of the present invention.
Figure 12:
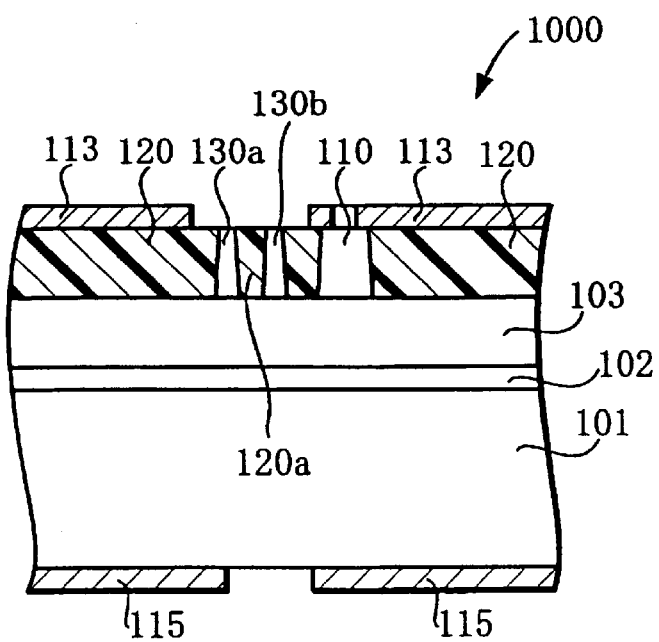
FIG. 12 is a sectional view along the line C—C in FIG. 11.

FIG. 11 is a schematic plan view of one step in a method of manufacturing the surface emission type semiconductor laser according to this embodiment of the present invention, and FIG. 12 is a sectional view along the line C—C in FIG. 11. FIG. 11 corresponds to FIG. 7, which shows the first embodiment.

This embodiment of the surface emission laser 400 has a different structure of the separating semiconductor layer from the surface emission laser 100 of the first embodiment. In other respects, basically this is the same as the first embodiment, and therefore portions with substantially the same functions are given the same reference numerals, and detailed description is omitted.

In the wafer 1000 having the surface emission laser 400 shown in FIGS. 11 and 12, two separating semiconductor layers 130a and 130b are formed along the chip boundary regions. The separating semiconductor layers 130a and 130b are each continuous. Then between the separating semiconductor layer 130a and separating semiconductor layer 130b, insulation layer 120a is formed. The insulation layer 120a is formed in the same step as the embedding insulation layer 120.

In this embodiment, the wafer 1000 can be separated into chips by dicing, cutting the insulation layer 120a along the separation line 1100. The insulation layer 120a is delineated by the separating semiconductor layers 130a and 130b, and therefore even if the dicing applies a certain degree of pressure to the insulation layer 120a, the external force can be dissipated by the separating semiconductor layers 130a and 130b. For this reason, there is no adverse effect on the characteristics of the surface emission laser 400, and the wafer 1000 can be separated by dicing.

In this embodiment of the surface emission laser 400, the structure is such that at the margin, the insulation layer 120a after separation and the separating semiconductor layer 130a or 130b on its inside are disposed continuously.

Fourth Embodiment

Figure 13A:
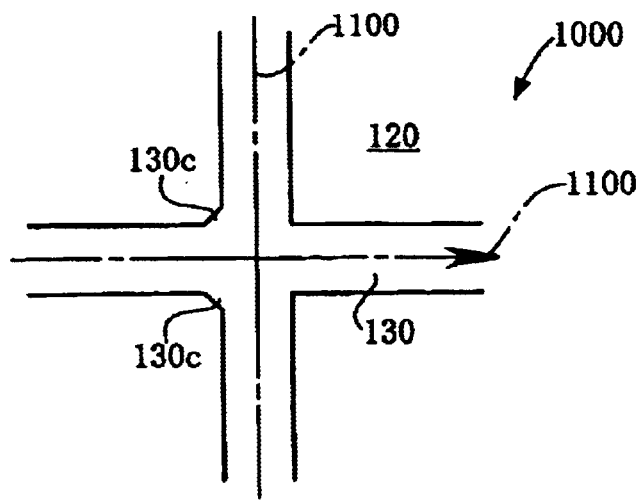
FIGS. 13A to 13C are schematic plan views of one step in a method of manufacturing the surface emission type semiconductor laser according to a fourth embodiment of the present invention.
Figure 13B:
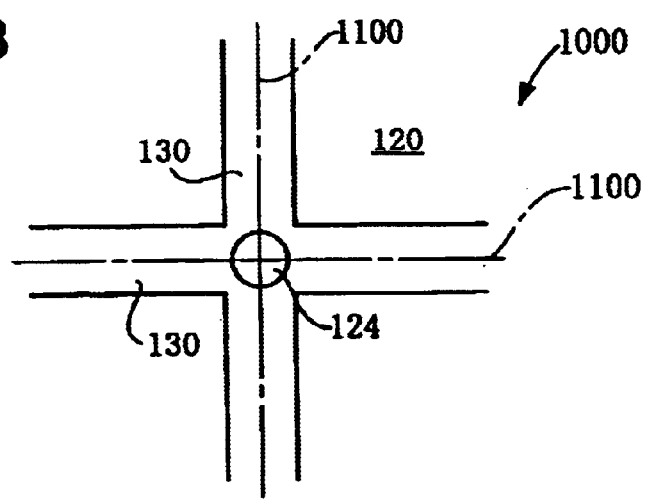
Figure 13C:
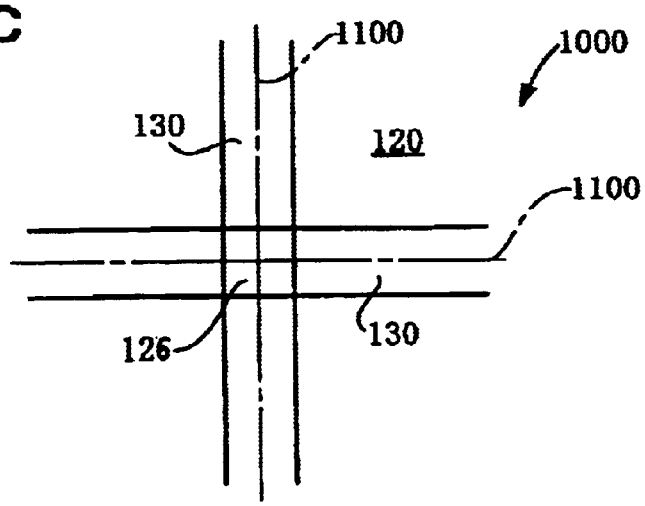

FIGS. 13A to 13C are partial plan views showing a part of this embodiment.

This embodiment of the surface emission laser has a different structure of the separating semiconductor layer from the surface emission laser of the first embodiment. In other respects, basically this is the same as the first embodiment, and therefore portions with substantially the same functions are given the same reference numerals, and detailed description is omitted.

In this embodiment, the area where the separation lines 1100 intersect has a structure in which the separating semiconductor layer 130 is reinforced.

For example, in the example shown in FIG. 13A, in the intersecting region of the separating semiconductor layer 130, a pair of corner portions 130c is formed from the semiconductor layer symmetrically with respect to one direction of the separation lines 1100. These corner portions 130c are patterned in the same step as the separating semiconductor layer 130. By forming such corner portions 130c, the corners of the separating semiconductor layer 130 are reinforced. As a result, when the wafer 1000 is separated along the separation line 1110, the corners of the chips are less likely to be broken. In the example shown in the drawing, for example, this effect can easily be exploited by separating along the vertical separation line 1100, then in the arrow direction along the horizontal separation line 1100.

In the example shown in FIG. 13B, in a part of the intersecting region of the separating semiconductor layer 130, an insulation layer 124 is formed. This insulation layer 124 is formed in the same step as the embedding insulation layer formed of the resin material 120, and is less easily split than the semiconductor, as a result of which when the separating semiconductor layer 130 is separated, the corners of the chips are less likely to be broken. In the example shown in the drawing, the insulation layer 124 has a circular plan form, but the plan form of the insulation layer 124 is not limited to this.

Similarly, in the example shown FIG. 13C, in the intersecting region of the separating semiconductor layer 130 an insulation layer 126 is formed. This insulation layer 126 is formed in the same step as the embedding insulation layer formed of the resin material 120, and since it is more difficult to split than the semiconductor, the corners of the chips are less likely to be broken when the separating semiconductor layer 130 is separated.

The structure of this embodiment can basically be applied to the surface emission laser of the present invention, and for example, to the first and second embodiments.

In the embodiments described above, on the semiconductor substrate 101, the n-type buffer layer 102 to the p-type contact layer 109 are formed in that order, but the order of conduction types maybe reversed. That is to say, in the resonator 140 shown in FIG. 2, the buffer layer 102 may be p-type GaAs, the lower mirror 103 alternately deposited layers comprising p-type AlAs layers and p-type $Al_{0.15}Ga_{0.85}As$ layers, the cladding layer 104 a p-type cladding layer of p-type $Al_{0.5}Ga_{0.5}As$, the cladding layer 106 an n-type cladding layer of n-type $Al_{0.5}As$, the upper mirror 108 alternately deposited layers comprising n-type $Al_{0.85}Ga_{0.15}As$ layers and n-type $Al_{0.15}Ga_{0.85}As$ layers, and the contact layer 109 n-type GaAs. In this case, the columnar portion formed as a resonator has lower resistance than that described above.

When the resonator 140 is formed with the conduction types reversed, the polarities of an upper electrode 113 and lower electrode 115 formed in a later stage are also reversed. That is to say, for example, an alloy layer comprising gold and germanium is used for forming the upper electrode, while an alloy layer comprising gold or zinc is similarly used for forming the lower electrode.

The proportions of Al and Ga in the composition of the lower mirror 103 and upper mirror 108 are not limited to these values, and the design may be made to optimized for the wavelength of the desired laser light to determine the composition.

Examples of the present invention applied to a surface emission laser have been described above, but the present invention is not limited to this, and various embodiments are possible within the scope of the present invention. For example, the present invention can be applied to a surface emission type semiconductor light-emitting device having a columnar portion formed of a semiconductor layer and an embedding insulation layer formed of a resin material, and may be applied not only to a surface emission laser, but also to a surface emission type light emitting diode.

What is claimed is:

1. A method of manufacturing a surface emission type semiconductor light-emitting device comprising:
    a step of forming a stacked semiconductor layer having a plurality of columnar portions over a semiconductor substrate;
    a step of forming an embedding insulation layer of a resin material around each of the columnar portions; and
    a step of separating the semiconductor substrate and layers on the semiconductor substrate to form chips,
    wherein in the step of forming the stacked semiconductor layer having the columnar portions, a separating semiconductor layer of a given pattern is formed in boundary regions of the chips,
    wherein in the step of forming the embedding insulation layer, at least an upper surface of the separating semiconductor layer is exposed, and
    wherein in the step of forming the chips, the separation is carried out using the separating semiconductor layer.

2. The method of manufacturing a surface emission type semiconductor light-emitting device as defined in claim 1,
    wherein the columnar portions and the separating semiconductor layer are patterned by lithography and etching after forming the stacked semiconductor layer on the semiconductor substrate.

3. The method of manufacturing a surface emission type semiconductor light-emitting device as defined in claim 1, further comprising:
    a step of forming an electrode layer in a given pattern, after the step of forming the embedding insulation layer.

4. The method of manufacturing a surface emission type semiconductor light-emitting device as defined in claim 3,
    wherein an end of the electrode layer is formed away from the separating semiconductor layer.

5. The method of manufacturing a surface emission type semiconductor light-emitting device as defined in claim 1,
    wherein the separating semiconductor layer is continuously formed in the boundary regions of the chips, and the separation is carried out along the separating semiconductor layer.

6. The method of manufacturing a surface emission type semiconductor light-emitting device as defined in claim 1,
    wherein the separating semiconductor layer is discontinuously formed in the boundary regions of the chips, and the separation is carried out along the separating semiconductor layer.

7. The method of manufacturing a surface emission type semiconductor light-emitting device as defined in claim 1,
    wherein two of the separating semiconductor layers are formed with a given spacing in the boundary regions of the chips, and the separation is carried out between the two separating semiconductor layers.

8. The method of manufacturing a surface emission type semiconductor light-emitting device as defined in claim 7,
    wherein between the two separating semiconductor layers, an insulation layer is formed in the step of forming the embedding insulation layer.

9. The method of manufacturing a surface emission type semiconductor light-emitting device as defined in claim 1,
    wherein the separating semiconductor layer has a reinforcing portion formed in an intersecting region thereof.

10. The method of manufacturing a surface emission type semiconductor light-emitting device as defined in claim 9,
    wherein the reinforcing portion is formed of a semiconductor layer formed at a corner of the separating semiconductor layer.

11. The method of manufacturing a surface emission type semiconductor light-emitting device as defined in claim 9,
    wherein the reinforcing portion is formed of an insulation layer formed in an intersecting region of the separating semiconductor layer, and the insulation layer is formed in the step of forming the embedding insulation layer.

12. A surface emission type semiconductor light-emitting device, the semiconductor light-emitting device comprising:
    a stacked semiconductor layer formed over a semiconductor substrate, and having a columnar portion;
    an embedding insulation layer of a resin material formed around the columnar portion;
    an electrode layer formed on at least a part of an upper surface of the columnar portion and a part of an upper surface of the embedding insulation layer; and
    a separating semiconductor layer formed above an edge region of the semiconductor substrate.

13. The surface emission type semiconductor light-emitting device as defined in claim 12,
    wherein the separating semiconductor layer has the same stacked structure as the columnar portion of the stacked semiconductor layer.

14. The surface emission type semiconductor light-emitting device as defined in claim 12,
    wherein an end of the electrode layer is formed away from the separating semiconductor layer.

15. The surface emission type semiconductor light-emitting device as defined in claim 12,
    wherein the separating semiconductor layer is continuously formed above the edge region of the semiconductor substrate.

16. The surface emission type semiconductor light-emitting device as defined in claim 12,
    wherein the separating semiconductor layer is discontinuously formed above the edge region of the semiconductor substrate.

17. The surface emission type semiconductor light-emitting device as defined in claim 12,
    wherein an insulation layer is formed above the edge region of the semiconductor substrate, and the separating semiconductor layer is located inside the insulation layer.

18. The surface emission type semiconductor light-emitting device as defined in claim 12, wherein the separating semiconductor layer has a reinforcing portion formed in an intersecting region thereof.

19. The surface emission type semiconductor light-emitting device as defined in claim 18, wherein the reinforcing portion is formed of a semiconductor layer formed at a corner of the separating semiconductor layer.

20. The surface emission type semiconductor light-emitting device as defined in claim 18, wherein the reinforcing portion is formed of an insulation layer formed in an intersecting region of the separating semiconductor layer, and the insulation layer has the same layer construction as the embedding insulation layer.

21. The surface emission type semiconductor light-emitting device as defined in claim 12, wherein the columnar portion constitutes at least a part of a resonator of a semiconductor laser.

22. The surface emission type semiconductor light-emitting device as defined in claim 12, wherein the columnar portion constitutes at least a part of a light emitting diode.

* * * * *